United States Patent
Prucker

(10) Patent No.: US 12,140,611 B2
(45) Date of Patent: Nov. 12, 2024

(54) PROTECTION OF AN AC DEVICE

(71) Applicant: Siemens Energy Global GmbH & Co. KG, Munich (DE)

(72) Inventor: Udo Prucker, Schwaig (DE)

(73) Assignee: HSP Hochspannungsgeräte GmbH, Troisdorf (DE)

( * ) Notice: Subject to any disclaimer, the term of this patent is extended or adjusted under 35 U.S.C. 154(b) by 256 days.

(21) Appl. No.: 17/633,650

(22) PCT Filed: Jul. 10, 2020

(86) PCT No.: PCT/EP2020/069489
§ 371 (c)(1),
(2) Date: Feb. 8, 2022

(87) PCT Pub. No.: WO2021/023472
PCT Pub. Date: Feb. 11, 2021

(65) Prior Publication Data
US 2022/0317157 A1 Oct. 6, 2022

(30) Foreign Application Priority Data
Aug. 8, 2019 (DE) .................... 10 2019 211 948.4

(51) Int. Cl.
*G01R 1/36* (2006.01)
*H01F 3/14* (2006.01)
*H01F 38/26* (2006.01)

(52) U.S. Cl.
CPC .............. *G01R 1/36* (2013.01); *H01F 3/14* (2013.01); *H01F 38/26* (2013.01)

(58) Field of Classification Search
CPC ........ G01R 1/36; G01R 15/183; G01R 19/00; G01R 21/06; G01R 15/18; G01R 21/133; G01R 19/12; H01F 27/425; H01F 3/14; H01F 38/26; H01F 38/30; H02H 9/02; H02H 7/22; H02H 7/28; H02J 3/00125; H02J 3/36; H02J 50/12; H02J 50/40; H02J 7/00712; H02J 3/14; H02J 3/1807; H02J 4/00; H02J 50/10; H02J 50/70
See application file for complete search history.

(56) References Cited

U.S. PATENT DOCUMENTS

| | | | | |
|---|---|---|---|---|
| 2,089,860 A | * | 8/1937 | Rypinski | H01F 27/42 336/134 |
| 3,111,619 A | * | 11/1963 | Gertsch | H02H 9/007 323/355 |
| 3,240,957 A | * | 3/1966 | Nishidai | H02H 9/007 323/233 |

(Continued)

FOREIGN PATENT DOCUMENTS

| | | |
|---|---|---|
| AT | 365852 B | 2/1982 |
| CN | 202905386 U | 4/2013 |

(Continued)

*Primary Examiner* — Vinh P Nguyen
(74) *Attorney, Agent, or Firm* — Laurence A. Greenberg; Werner H. Stemer; Ralph E. Locher

(57) ABSTRACT

A protection device protects an AC device, in particular an inductive voltage converter, electrically connected to an AC line, from damage caused by direct currents flowing in the AC line. In this case, at least one current transfer coil, which runs around a magnetic core section of a magnetic core, is connected to the AC line in parallel with the AC device.

12 Claims, 2 Drawing Sheets

(56) References Cited

U.S. PATENT DOCUMENTS

| | | | | | |
|---|---|---|---|---|---|
| 3,489,975 | A | * | 1/1970 | Entremont | H01F 27/425 |
| | | | | | 336/182 |
| 3,851,239 | A | * | 11/1974 | Suzuki | H02M 3/28 |
| | | | | | 315/209 CD |
| 4,103,221 | A | | 7/1978 | Fukui et al. | |
| 4,837,497 | A | * | 6/1989 | Leibovich | G05F 3/04 |
| | | | | | 336/12 |
| 10,622,798 | B2 | | 4/2020 | Bartminn et al. | |
| 2013/0176093 | A1 | | 7/2013 | Summer | |

FOREIGN PATENT DOCUMENTS

| | | | |
|---|---|---|---|
| CN | 103227045 | A | 7/2013 |
| CN | 105957696 | A | 9/2016 |
| CN | 205882640 | U | 1/2017 |
| DE | 638210 | A | 11/1936 |
| DE | 2424131 | A | 12/1974 |
| DE | 102009043596 | A1 | 3/2011 |
| DE | 102011107252 | A1 | 1/2013 |
| DE | 102016205118 | A1 | 10/2017 |
| JP | H01165613 | U | 11/1989 |

* cited by examiner

PROTECTION OF AN AC DEVICE

FIELD AND BACKGROUND OF THE INVENTION

The invention relates to a protection device and a method for protecting an AC device electrically connected to an AC line, a measuring arrangement for measuring an AC voltage on an AC line, and also a power transmission system and the use thereof.

Hereinafter, power lines that carry AC current and AC voltage are referred to as AC lines, and power lines that carry DC current and DC voltage are referred to as DC lines. DC lines are used in particular for power transmission over great distances with high DC voltages by means of so-called high-voltage direct current (HVDC) transmission. In order to efficiently install AC lines and DC lines of electricity grids, AC lines and DC lines can be suspended between the same line masts as overhead lines at least in sections and can accordingly run parallel to one another between these line masts. Particularly at DC lines carrying high DC voltages, ionization of the air surrounding the DC lines can occur. If an AC line runs adjacent to a DC line, such ionization can cause ion currents to the AC line, which cause DC currents flowing in the AC line. Such DC currents in an AC line can attain current intensities of typically approximately 100 mA. During normal operation of an AC voltage system, these DC currents can flow away for example via a power transformer connected to the AC line. However, if the AC line is connected to the primary winding of an inductive voltage transformer and was isolated without being grounded, or no power transform is present or the power transformer is disconnected, the DC currents flow via the primary winding of the voltage transformer, whereby the voltage transformer is driven to magnetic saturation and thereby thermally overloaded and destroyed.

SUMMARY OF THE INVENTION

The invention is based on the object of specifying a protection device and a method for protecting an AC device electrically connected to an AC line, in particular an inductive voltage transformer, against damage as a result of DC currents flowing in the AC line, particularly if a DC line, for example an HVDC line, runs adjacent to the AC line.

The object is achieved according to the invention by means of a protection device having the features of the independent protection device claim, a method having the features of the independent method claim, a measuring arrangement having the features of the independent measuring arrangement claim, a power transmission system having the features of the independent power transmission system claim, and the use thereof having the features of the independent use claim.

The dependent claims relate to advantageous configurations of the invention.

A protection device according to the invention for an AC device electrically connected to an AC line comprises at least one current drain coil connected to the AC line in parallel with the AC device, and for each current drain coil a magnetic core having a first magnetic core section, around which the current drain coil runs.

The parallel connection of the at least one current drain coil of the protection device and the AC device to be protected causes the current to be divided between the at least one current drain coil and the AC device. As a result, a lower current flows through the AC device. In particular, DC currents which flow through the AC device and which can damage or destroy the AC device are reduced. Each magnetic core is preferably designed in such a way that it is not driven to magnetic saturation just when relatively small DC currents are present. The protection device can have a plurality of current drain coils, in particular, each of which is connected in parallel with the AC device and runs around a magnetic core section of a magnetic core.

One configuration of the protection device provides for at least one magnetic core to have at least one air gap. In particular, the first magnetic core section of at least one magnetic core can have at least one air gap. Furthermore, at least one magnetic core can have a second magnetic core section, around which the current drain coil does not run and which has at least one air gap. The embodiment of at least one magnetic core with at least one air gap advantageously has the effect that the magnetic saturation of the magnetic core commences only at significantly higher magnetic field strengths than in the case of an otherwise identical magnetic core without an air gap. In order to achieve the same effect with a magnetic core without an air gap, the cross section of the magnetic core would have to be significantly increased, which would increase the material costs and the space requirement for the measuring arrangement. In particular, provision can advantageously be made for at least one magnetic core to have at least one air gap in the first magnetic core section surrounded by a current drain coil, and at least one air gap in a second magnetic core section. It is thereby possible to access an air gap in the second magnetic core section in order to optimize the magnetic properties of the magnetic core.

In the method according to the invention for protecting an AC device electrically connected to an AC line, accordingly each current drain coil of a protection device according to the invention is electrically connected to the AC line in parallel with the AC device.

A measuring arrangement according to the invention for measuring an AC voltage on an AC line comprises an inductive voltage transformer having a primary winding having a first primary winding end, which is electrically connectable to the AC line, and at least one protection device according to the invention, wherein each current drain coil of the protection device is connected in parallel with the primary winding of the voltage transformer, and the protection device has a lower effective electrical resistance than the primary winding of the voltage transformer. By way of example, the effective resistance of the protection device has a magnitude of at most half that of the effective resistance of the primary winding of the voltage transformer. By virtue of the fact that the protection device has a lower effective resistance than the primary winding of the voltage transformer, the majority of the current flows through the protection device, and the primary winding of the voltage transformer is particularly well protected against damage as a result of DC currents.

One configuration of the measuring arrangement provides for a second primary winding end of the primary winding of the voltage transformer to be connected to a ground potential. As a result, the second primary winding end is connected to a defined reference potential.

A power transmission system according to the invention comprises a DC line, an AC line running adjacent to the DC line, and a measuring arrangement according to the invention, the first primary winding end of which is electrically connected to the AC line. By way of example, the DC line and the AC line are overhead lines and/or they are suspended between the same line masts at least in sections.

Such a power transmission system makes possible in particular a high-voltage direct current transmission via the DC line without the abovementioned endangering of the voltage transformer connected to the AC line by ion currents caused by the DC line, since DC currents that would otherwise flow via the voltage transformer substantially flow via the current drain coil of the measuring arrangement and do not drive the voltage transformer to magnetic saturation.

Accordingly, the invention provides in particular the use of a power transmission system according to the invention for a high-voltage direct current transmission via the DC line.

The above-described properties, features and advantages of this invention and the way in which they are achieved will become clearer and more clearly understood in association with the following description of exemplary embodiments which are explained in greater detail in association with the drawings, in which:

DETAILED DESCRIPTION OF THE INVENTION

Mutually corresponding parts are provided with the same reference signs in the figures.

Figure 1:
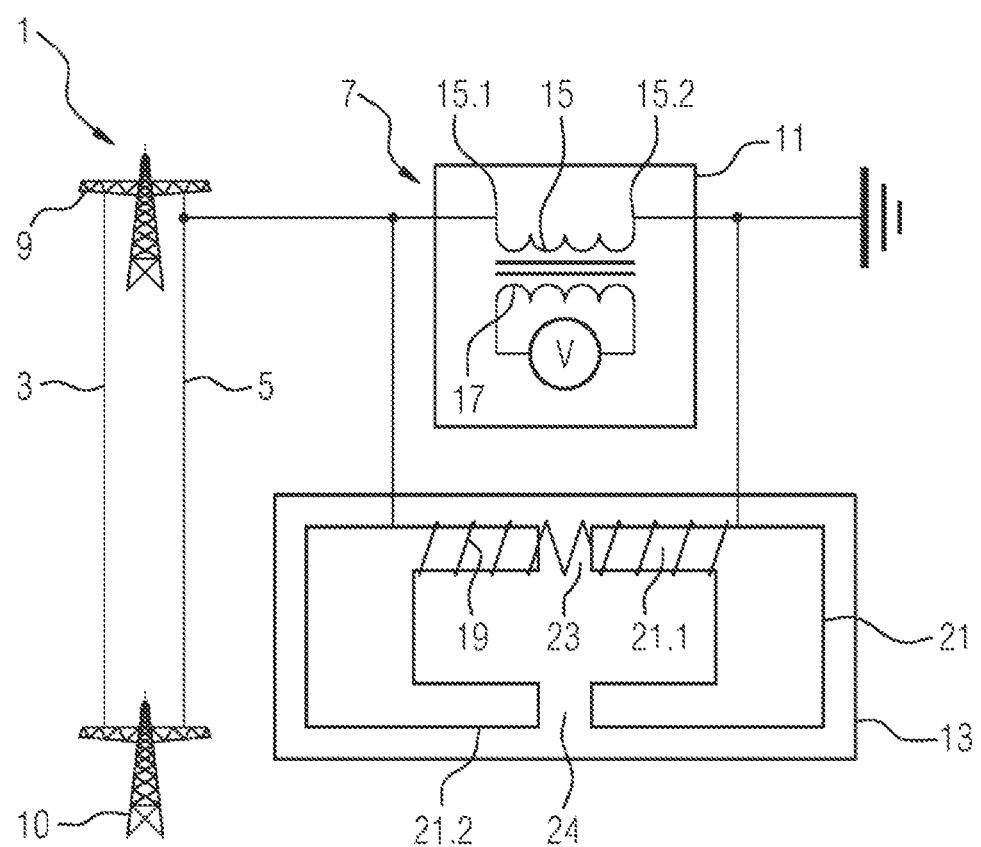
FIG. 1 shows a block diagram of one exemplary embodiment of a power transmission system.

FIG. 1 (FIG. 1) shows a block diagram of one exemplary embodiment of a power transmission system 1 according to the invention. The power transmission system 1 comprises a DC line 3, an AC line 5 and one exemplary embodiment of a measuring arrangement 7 according to the invention for measuring an AC voltage on the AC line 5.

The DC line 3 and the AC line 5 are suspended between the same line masts 9, 10 at least in sections. FIG. 1 illustrates by way of example only one section each of the DC line 3 and the AC line 5, these sections running parallel and adjacent to one another as overhead lines between two line masts 9, 10. The DC line 3 is an HVDC line, for example, and the AC line 5 is a line of an AC grid.

The measuring arrangement 7 comprises an inductive voltage transformer 11 and a protection device 13 according to the invention. The voltage transformer 11 has a primary winding 15 and a secondary winding 17. A first primary winding end 15.1 of the primary winding 15 is electrically connected to the AC line 5. A second primary winding end 15.2 of the primary winding 15 is connected to a ground potential. A secondary voltage is tapped off at the secondary winding 17 the AC voltage present on the AC line 5 in relation to the ground potential being determined from said secondary voltage.

The protection device 13 comprises a current drain coil 19 and a magnetic core 21. The current drain coil 19 is connected in parallel with the primary winding 15 of the voltage transformer 11 and has a significantly lower effective electrical resistance than the primary winding 15. By way of example, the effective resistance of the primary winding 15 has a magnitude at least ten times that of the effective resistance of the current drain coil 19.

The current drain coil 19 runs around a first magnetic core section 21.1 of the magnetic core 21, which has an air gap 23. In a second magnetic core section 21.2, around which the current drain coil 19 does not run, the magnetic core 21 has a further air gap 24. The air gaps 23, 24 are each filled for example with hard paper or a pressboard (not illustrated). Other exemplary embodiments of the protection device 13 can have in particular a magnetic core 21 having more than only two air gaps 23, 24.

Figure 2:
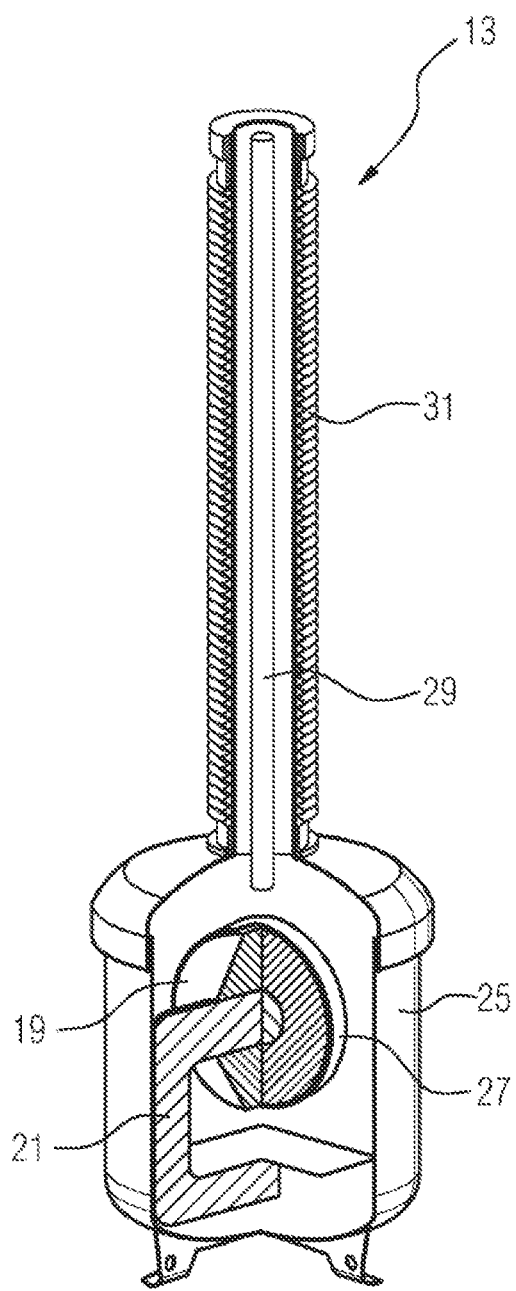
FIG. 2 shows a cut-away perspective illustration of one exemplary embodiment of a protection device.

FIG. 2 (FIG. 2) shows a cut-away perspective illustration of one exemplary embodiment of a protection device 13. The current drain coil 19 and the magnetic core 21 are arranged in a housing 25. A shielding electrode 27 for shielding electric fields in relation to the housing 25 is arranged around the current drain coil 19. An electrical conductor 29 is led out of the housing 25, said electrical conductor being surrounded by a hollow insulator 31 outside the housing 25 and the current drain coil 19 being contactable from outside via said electrical conductor.

Although the invention has been more specifically illustrated and described in detail by means of preferred exemplary embodiments, nevertheless the invention is not restricted by the examples disclosed and other variations can be derived therefrom by the person skilled in the art, without departing from the scope of protection of the invention.

The invention claimed is:

1. A protection device for an AC device having a device core and a winding electrically connected to an AC line, the protection device comprising:
   at least one current drain coil separate from the AC device and connected to the AC line in parallel with the AC device; and
   a magnetic core separate from the device core and having a first magnetic core section, said at least one current drain coil wraps around said first magnetic core section.

2. The protection device according to claim 1, wherein:
   said magnetic core is one of a plurality of magnetic cores; and
   said at least one current drain coil is one of a plurality of current drain coils, one of said drain coils wraps around said first magnetic core section of each of said magnetic cores, at least one of said magnetic cores has at least one air gap formed therein.

3. The protection device according to claim 1, wherein said first magnetic core section of said magnetic core has at least one air gap formed therein.

4. The protection device according to claim 1, wherein said magnetic core has a second magnetic core section, said at least one current drain coil does not wraps around said second magnetic core section and said second magnetic core section has at least one air gap formed therein.

5. A method for protecting an AC device having a device core and a winding electrically connected to an AC line against damage as a result of DC currents flowing in the AC line, which comprises the step of:
   providing a protection device containing at least one current drain coil and a magnetic core having a first magnetic core section, said at least one current drain coil wraps around said first magnetic core section the at least on magnetic core and the current drain coil being separate from the AC device; and
   electrically connecting the at least one current drain coil of the protection device to the AC line in parallel with the AC device.

6. A measuring configuration for measuring an AC voltage on an AC line, the measuring configuration comprising:
   an inductive voltage transformer having a primary winding with a first primary winding end being electrically connectable to the AC line;
   at least one protection device containing at least one current drain coil and a magnetic core having a first magnetic core section, said at least one current drain coil wraps around said first magnetic core section and
said at least one current drain coil of said at least one protection device is connected in parallel with said primary winding of said voltage transformer, said at least one current drain coil having a lower effective electrical resistance than said primary winding of said voltage transformer.

7. The measuring configuration according to claim 6, wherein the effective resistance of said primary winding of said voltage transformer has a magnitude at least double that of an effective resistance of said at least one current drain coil.

8. The measuring configuration according to claim 6, wherein said primary winding has a second primary winding end connected to a ground potential.

9. A power transmission system, comprising:
a DC line;
an AC line running adjacent to said DC line; and
a measuring configuration for measuring an AC voltage on said AC line, said measuring configuration containing:
an inductive voltage transformer having a primary winding with a first primary winding end electrically connected to said AC line;
at least one protection device containing at least one current drain coil and a magnetic core having a first magnetic core section, said at least one current drain coil wraps around said first magnetic core section and
said at least one current drain coil of said at least one protection device is connected in parallel with said primary winding of said voltage transformer, said at least one current drain coil having a lower effective electrical resistance than said primary winding of said voltage transformer.

10. The power transmission system according to claim 9, wherein said DC line and said AC line are suspended between same line masts at least in sections.

11. The power transmission system according to claim 9, wherein said DC line and said AC line are overhead lines.

12. A method of using a power transmission system, which comprises the steps of:
providing a power transmission system containing a DC line, an AC line running adjacent to the DC line and a measuring configuration for measuring an AC voltage on the AC line, the measuring configuration containing:
an inductive voltage transformer having a primary winding with a first primary winding end electrically connected to the AC line;
at least one protection device containing at least one current drain coil and a magnetic core having a first magnetic core section, said at least one current drain coil wraps around said first magnetic core section and
the at least one current drain coil of the at least one protection device is connected in parallel with the primary winding of the voltage transformer, the at least one current drain coil having a lower effective electrical resistance than the primary winding of the voltage transformer; and
using the power transmission system for a high-voltage direct current transmission via the DC line.

* * * * *

UNITED STATES PATENT AND TRADEMARK OFFICE
CERTIFICATE OF CORRECTION

| | |
|---|---|
| PATENT NO. | : 12,140,611 B2 |
| APPLICATION NO. | : 17/633650 |
| DATED | : November 12, 2024 |
| INVENTOR(S) | : Udo Prucker |

It is certified that error appears in the above-identified patent and that said Letters Patent is hereby corrected as shown below:

In the Claims

Column 4, Claim 5, Lines 48-60 should read as follows:
5. A method for protecting an AC device having a device core and a winding electrically connected to an AC line against damage as a result of DC currents flowing in the AC line, which comprises the step of:
    providing a protection device containing at least one current drain coil and a magnetic core having a first magnetic core section, said at least one current drain coil wraps around said first magnetic core section, the at least one magnetic core and the current drain coil being separate from the AC device; and
    electrically connecting the at least one current drain coil of the protection device to the AC line in parallel with the AC device.

Signed and Sealed this
Thirty-first Day of December, 2024

Derrick Brent
*Acting Director of the United States Patent and Trademark Office*